United States Patent
Hong

(10) Patent No.: US 12,080,332 B2
(45) Date of Patent: Sep. 3, 2024

(54) MEMORY DEVICE, A MEMORY SYSTEM HAVING THE SAME AND AN OPERATING METHOD THEREOF IN WHICH A ROW ADDRESS IS NOT SEPARATED DEPENDING ON PAGES IN A BYTE MODE OPERATION

(71) Applicant: SAMSUNG ELECTRONICS CO., LTD., Suwon-si (KR)

(72) Inventor: Seungki Hong, Incheon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 143 days.

(21) Appl. No.: 17/834,320

(22) Filed: Jun. 7, 2022

(65) Prior Publication Data

US 2023/0143468 A1   May 11, 2023

(30) Foreign Application Priority Data

Nov. 5, 2021 (KR) .......................... 10-2021-0151056

(51) Int. Cl.
*G11C 7/00* (2006.01)
*G11C 11/406* (2006.01)

(52) U.S. Cl.
CPC .. *G11C 11/40615* (2013.01); *G11C 11/40603* (2013.01); *G11C 11/40622* (2013.01)

(58) Field of Classification Search
CPC .............................................. G11C 11/40615
USPC ....................................................... 365/222
See application file for complete search history.

(56) References Cited

U.S. PATENT DOCUMENTS

| | | | |
|---|---|---|---|
| 9,589,606 B2 | 3/2017 | Lin et al. | |
| 9,727,258 B1* | 8/2017 | Nazarian | G11C 16/0483 |
| 9,767,883 B2 | 9/2017 | Doo et al. | |
| 9,799,391 B1 | 10/2017 | Wei | |
| 9,892,779 B2 | 2/2018 | Kang et al. | |
| 9,972,377 B2 | 5/2018 | Oh et al. | |
| 9,978,440 B2 | 5/2018 | Cho | |
| 10,090,039 B2 | 10/2018 | Doo et al. | |
| 10,223,311 B2 | 3/2019 | Doo et al. | |
| 10,255,989 B2 | 4/2019 | Cha et al. | |
| 10,446,216 B2 | 10/2019 | Oh et al. | |
| 10,600,470 B2 | 3/2020 | Bang | |
| 10,607,683 B2 | 3/2020 | Shin et al. | |
| 10,719,467 B2 | 7/2020 | Doo et al. | |
| 10,770,127 B2 | 9/2020 | Shore et al. | |
| 10,811,077 B2 | 10/2020 | Shin et al. | |
| 10,860,222 B2 | 12/2020 | Shin et al. | |
| 11,011,219 B2 | 5/2021 | Yen et al. | |
| 11,037,617 B2 | 6/2021 | Gans | |
| 11,049,544 B2 | 6/2021 | Devaux et al. | |
| 11,087,821 B2 | 8/2021 | Son et al. | |
| 11,107,531 B2 | 8/2021 | Kim | |

(Continued)

*Primary Examiner* — Hoai V Ho
(74) *Attorney, Agent, or Firm* — F. CHAU & ASSOCIATES, LLC

(57) ABSTRACT

An operating method of a memory device, the method including, receiving a row address, determining whether an operating mode is a byte mode, counting up an access count value for the row address while ignoring a page bit, when the operating mode is the byte mode, selecting a target row hammer address among target row addresses using access count values for the target row hammer address, calculating a victim row address corresponding to the target row hammer address, and performing a target refresh operation on the victim row address.

15 Claims, 17 Drawing Sheets

(56) References Cited

U.S. PATENT DOCUMENTS

| | | |
|---|---|---|
| 11,197,531 B2 | 12/2021 | Hogan |
| 2019/0333573 A1* | 10/2019 | Shin ...................... G11C 11/408 |
| 2022/0199148 A1 | 6/2022 | Hong et al. |
| 2022/0208251 A1 | 6/2022 | Hong et al. |

* cited by examiner

| Row Hammer Address | Count |
|---|---|
| RHA1 | 100 |
| RHA2 | 200 |
| RHA3 | 500 | → RHA Selection
| RHA4 | 250 |
| RHA5 | 150 |

| Row Hammer Address | Count |
|---|---|
| RHA1 | 100 |
| RHA2 | 100 |
| RHA3 | 100 |
| RHA4 | 100 |
| RHA5 | 100 | → RHA Selection

MEMORY DEVICE, A MEMORY SYSTEM HAVING THE SAME AND AN OPERATING METHOD THEREOF IN WHICH A ROW ADDRESS IS NOT SEPARATED DEPENDING ON PAGES IN A BYTE MODE OPERATION

CROSS-REFERENCE TO RELATED APPLICATION(S)

This application claims priority under 35 U.S.C. § 119 to Korean Patent Application No. 10-2021-0151056 filed on Nov. 5, 2021 in the Korean Intellectual Property Office, the disclosure of which is incorporated herein by reference in its entirety.

TECHNICAL FIELD

The present disclosure relates to a memory device, a memory system including the same, and a method of operating the same.

DISCUSSION OF RELATED ART

A dynamic random access memory (DRAM) is volatile memory in that it loses data when power is removed. Accordingly, the DRAM may perform a refresh operation to retain stored data. For example, the DRAM may retain data, stored in a cell capacitor, through the refresh operation. For example, a memory refresh circuit may periodically rewrite data in the capacitors, restoring them to their original charge. As the degree of integration of the DRAM increases, a distance between cells of the DRAM decreases. Due to the decrease in the distance between cells, disturbances from adjacent cells or wordlines can adversely impact data integrity. In some cases, when the disturbances intensively affect a specific cell, the DRAM may not be able to limit access to a specific address. Accordingly, disturbances may occur in a specific cell and may affect refresh characteristics of such a cell.

SUMMARY

Example embodiments of the present disclosure provide a memory device for reducing row hammer disturbance, a memory system including the same, and a method of operating the same.

Example embodiments of the present disclosure provide a memory device for improving row hammer detection efficiency, a memory system including the same, and a method of operating the same.

According to an example embodiment of the present disclosure, an operating method of a memory device includes: receiving a row address; determining whether an operating mode is a byte mode; counting up an access count value for the row address while ignoring a page bit, when the operating mode is the byte mode; selecting a target row hammer address, among target row addresses, using access count values for the target row hammer address; calculating a victim row address corresponding to the target row hammer address; and performing a target refresh operation on the victim row address.

According to an example embodiment of the present disclosure, a memory device includes: a first row address control unit configured to receive a row address and to output a signal indicating a first count-up scheme; a second row address control unit configured to receive the row address and to output a signal indicating a second count-up scheme while ignoring a page separation bit of the row address; counter control units configured to control a count-up operation for respective target row addresses by one of the first and second count-up schemes; counter and registers configured to increase an access count value according to control of each of the counter control units and to store the target row addresses and corresponding counted-up access count values; and a selector configured to select a target row address, corresponding to one access count value among access count values respectively stored in the counter and registers, as a row hammer address.

According to an example embodiment of the present disclosure, a memory system includes: at least one memory device; and a memory controller configured to control the at least one memory device, wherein: the at least one memory device detects a row hammer address while not considering a page separation bit of a row address in a byte mode operation, generates a victim address corresponding to the detected row hammer address, and performs a target refresh operation on the victim address.

BRIEF DESCRIPTION OF THE DRAWINGS

The above and other features of the present disclosure will be more clearly understood from the following detailed description, taken in conjunction with the accompanying drawings.

DETAILED DESCRIPTION OF THE EMBODIMENTS

Hereinafter, example embodiments of the present disclosure will be described with reference to the accompanying drawings.

In general, a selected wordline voltage is provided to a wordline selected in a read operation or a write operation. In this case, due to capacitive coupling, a voltage on the selected wordline may be increased even when the selected wordline voltage is not applied to adjacent wordlines. When a repeated access to the selected wordline is performed, charges may leak from memory cells corresponding to the adjacent wordlines. Such a phenomenon is referred to as a row hammer. A technology for detecting a row hammer and performing a refresh operation has been filed by Samsung Electronics and is described in U.S. Pat. Nos. 9,589,606, 9,767,883, 9,892,779, 9,972,377, 9,978,440, 10,090,039, 10,223,311, 10,719,467, 10,446,216, 10,600,470, 10,607,683, 10,811,077, 10,860,222, 11,087,821, and 11,107,531, the disclosures of which are incorporated by reference herein in their entireties.

In a memory device according to an example embodiment of the present disclosure, a memory system including the same, and a method of operating the same, row addresses may not be separated depending on pages in a byte mode operation, and thus, the efficiency of a register for detecting a row hammer address may be improved. The byte mode operation may be an operation performed in a mode in which data may be continuously input and output in units of bytes. For example, the byte mode operation may be performed in an X8 operating mode or an X16 operating mode. In the X8 operating mode, 8 bits (e.g., 1 byte) of data may be continuously input and output, and in the X16 operating mode, 16 bits (e.g., 2 bytes) of data may be continuously input and output.

Figure 1:
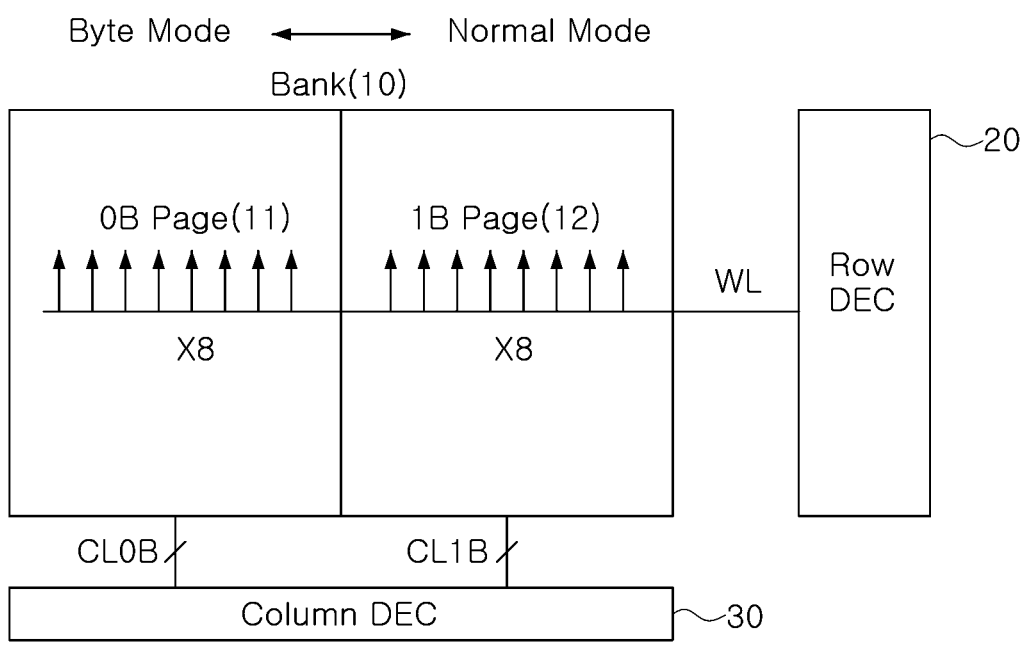
FIG. 1 is a diagram illustrating a memory device to describe a byte mode operation according to an example embodiment of the present disclosure.

FIG. 1 is a diagram illustrating a memory device 1 to describe a byte mode operation according to an example embodiment of the present disclosure. Referring to FIG. 1, the memory device 1 may include a bank 10, a row decoder 20, and a column decoder 30.

The row decoder 20 may be configured to activate a wordline WL in response to a row address. A first page (0B Page) 11 and a second page (1B Page) 12 may be connected to the wordline WL. When a byte mode operation is performed in an X8 mode, only one of the first and second pages 11 and 12 may be activated by the column decoder 30. For example, data may be continuously input and output in units of one byte (e.g., CL0B or CL1B). On the other hand, when the byte mode operation is performed in an X16 mode, both the first and second pages 11 and 12 may be activated. For example, data may be continuously input and output in units of two bytes.

Figure 2:
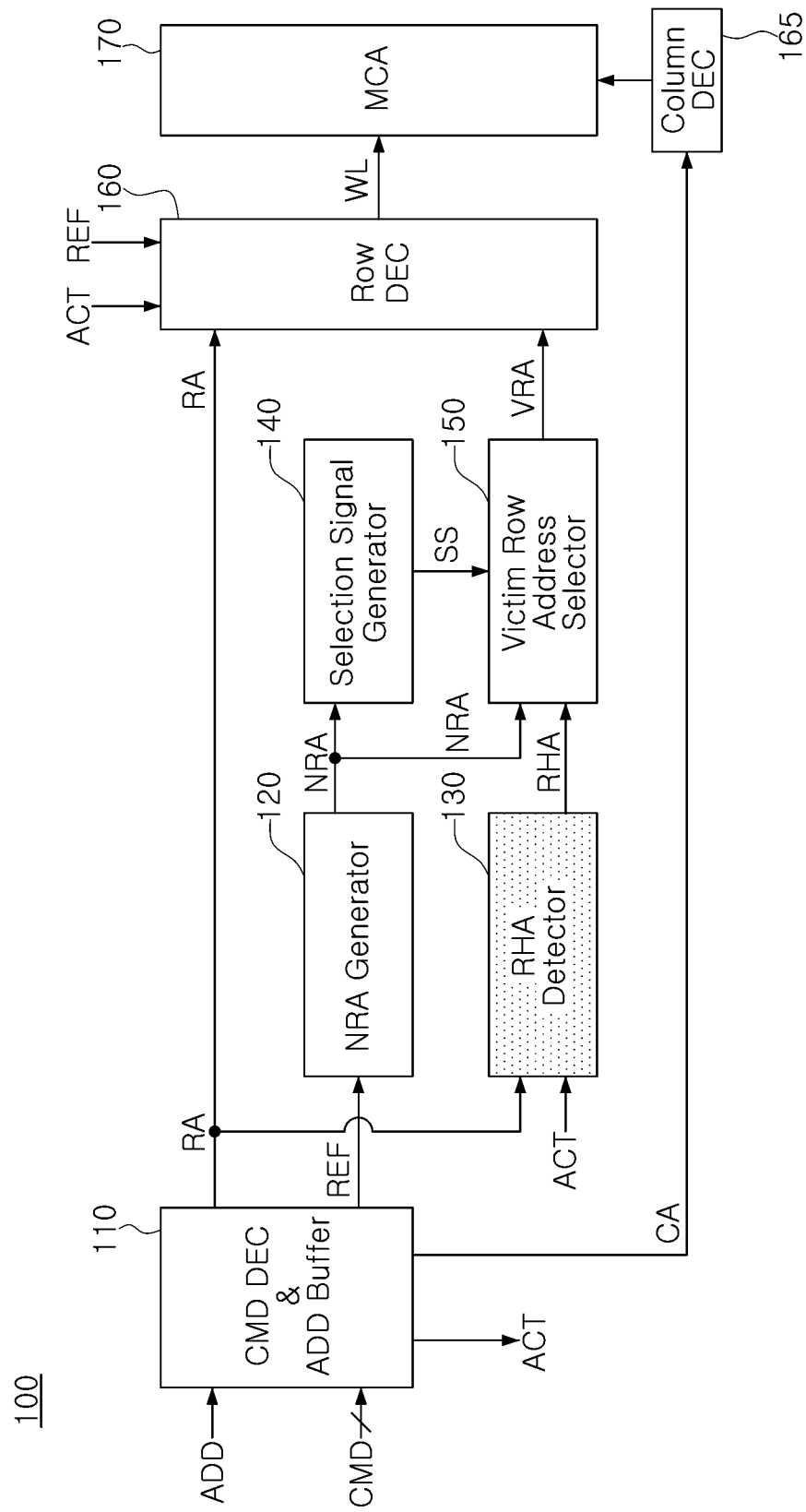
FIG. 2 is a diagram illustrating a memory device according to an example embodiment of the present disclosure.

FIG. 2 is a diagram illustrating a memory device 100 according to an example embodiment of the present disclosure. Referring to FIG. 2, the memory device 100 may include a command decoder and an address buffer 110, a normal refresh address generator 120, a row hammer address detector 130, a selection signal generator 140, and a victim row address generator 150, a row decoder 160, a column decoder 165, and a memory cell array 170.

The command decoder and address buffer 110 may decode a command CMD to generate an active command ACT, a refresh command REF, a read command, and a write command. The command decoder and the address buffer 110 may receive an address ADD to output a row address RA and a column address CA. The row address RA may be input together with the active command ACT, and the column address CA may be input together with the read command or the write command. The refresh command REF may be a self-refresh command or an auto-refresh command. When the refresh command REF is a self-refresh command, the refresh command REF may be internally generated. When the refresh command REF is an auto-refresh command, the refresh command REF may be provided from an external controller.

The normal refresh address generator 120 may be configured to generate a normal refresh address NRA in response to the refresh command REF. The normal refresh address NRA may be used to select a plurality of wordlines of the memory cell array MCA 170, or may be used to select a plurality of blocks of the memory cell array 170.

The row hammer address detector 130 may be configured to input the row address RA in response to the active command ACT and to detect and generate a row hammer address RHA. In an example embodiment of the present disclosure, the row hammer address RHA may be generated while ignoring a page bit for separating pages in a byte mode operation.

The selection signal generator 140 may be configured to generate a selection signal SS for selecting one of the normal refresh address NRA and the row hammer address RHA.

The victim row address generator 150 may be configured to select one of the normal refresh address NRA and the row hammer address RHA in response to the refresh command REF and the selection signal SS. For example, a first state of the selection signal SS may indicate the normal refresh address NRA is to be selected and a second state of the selection signal SS may indicate the row hammer address RHA is to be selected. In an example embodiment of the present disclosure, when the row hammer address RHA is selected, the victim row address generator 150 may output at least one adjacent row address of the row hammer address RHA as a victim row address VRA. In another example embodiment of the present disclosure, when the normal refresh address NRA is selected, the victim row address generator 150 may output the normal refresh address NRA as the victim row address VRA.

The row decoder 160 may decode the row address RA in response to the active command ACT to generate a wordline signal WL, or may decode at least one of the row address RA and the victim row address VRA to generate the wordline signal WL in response to the refresh command REF. A wordline of the memory cell array 170 may be activated by the generated wordline signal WL.

The column decoder 165 may be configured to activate column lines in response to the column address CA. For example, the column decoder 165 may activate different numbers of column lines according to different byte mode operations.

Figure 3A:
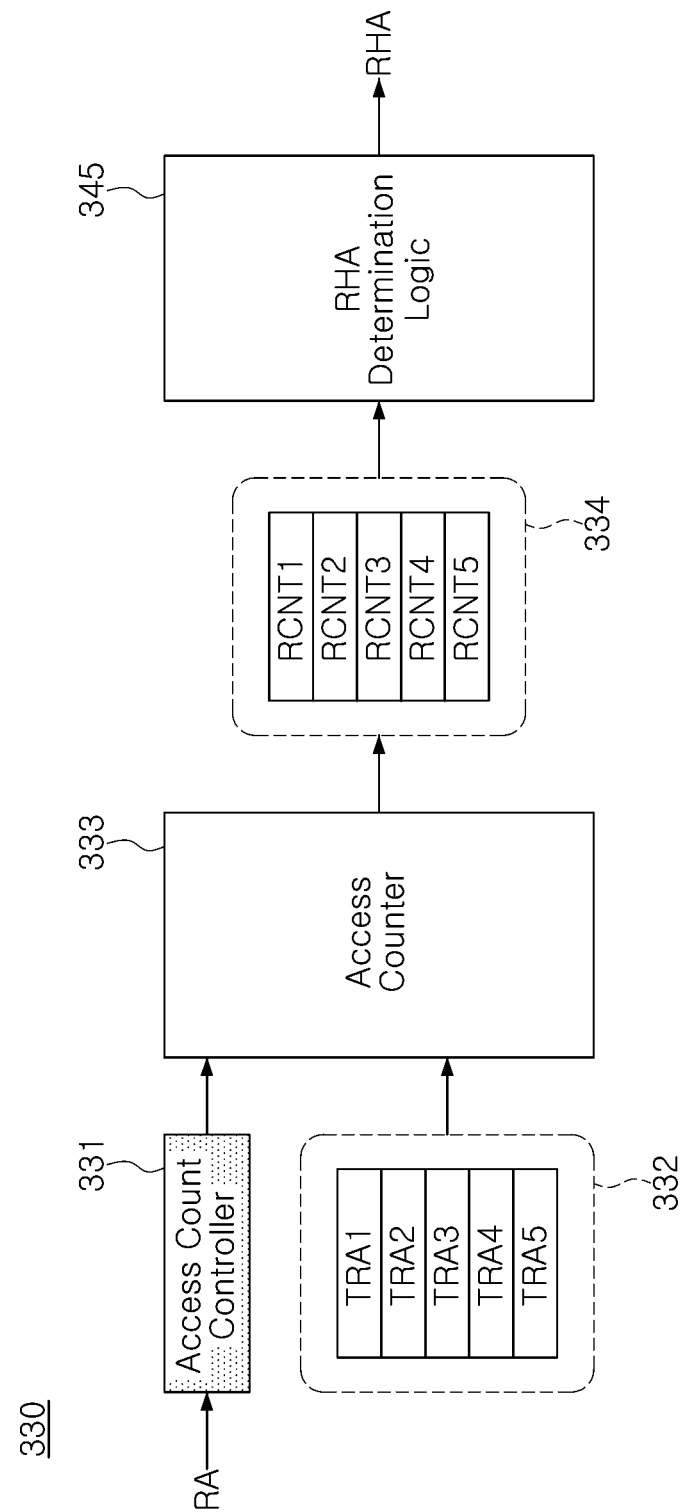
FIG. 3A is a diagram illustrating a row hammer address detector according to an example embodiment of the present disclosure.

FIG. 3A is a diagram illustrating a row hammer address detector 330 according to an example embodiment of the present disclosure.

Referring to FIG. 3A, the row hammer address detector 330 may include an access count controller 331, a target row address registers 332, an access counter 333, a row access count registers 334, and a row hammer address determination logic 345.

The access count controller 331 may be configured to receive the row address RA and to increase an access count value for the row address RA in different ways according to an operating mode.

The target row address registers 332 may be configured to store target row addresses. For example, the target row address registers 332 may store target row addresses TRA1-TRA5. In an example embodiment of the present disclosure, the target row addresses may be predetermined row addresses. In another example embodiment of the present disclosure, the target row addresses may be sequentially stored in order of accessing the memory device 100.

The access counter 333 may be configured to count up an access count value corresponding to the row address RA under the control of the access count controller 331. For example, when the operating mode is a normal operation mode, the access counter 333 may count up an access count value of the target row address, corresponding to the received row address RA, by one. On the other hand, when the operating mode is a byte operation mode, the access counter 333 may count up an access count value of at least one target row address, corresponding to a row address, by one while ignoring a page bit for separating pages in the received row address RA.

The row access count registers 334 may be configured to store access count values corresponding to target row addresses. For example, the row access count registers 334 may store access count values RCNT1-RCNT5 corresponding to the target row addresses TRA1-TRA5. In an example embodiment of the present disclosure, an access count value stored in each of the row access count registers 334 may be reset for an activated row address in response to the active command ACT.

The row hammer address determination logic 345 may read the access count values stored in the row access count registers 334, and may determine the row hammer address RHA according to a predetermined technique.

Figure 3B:
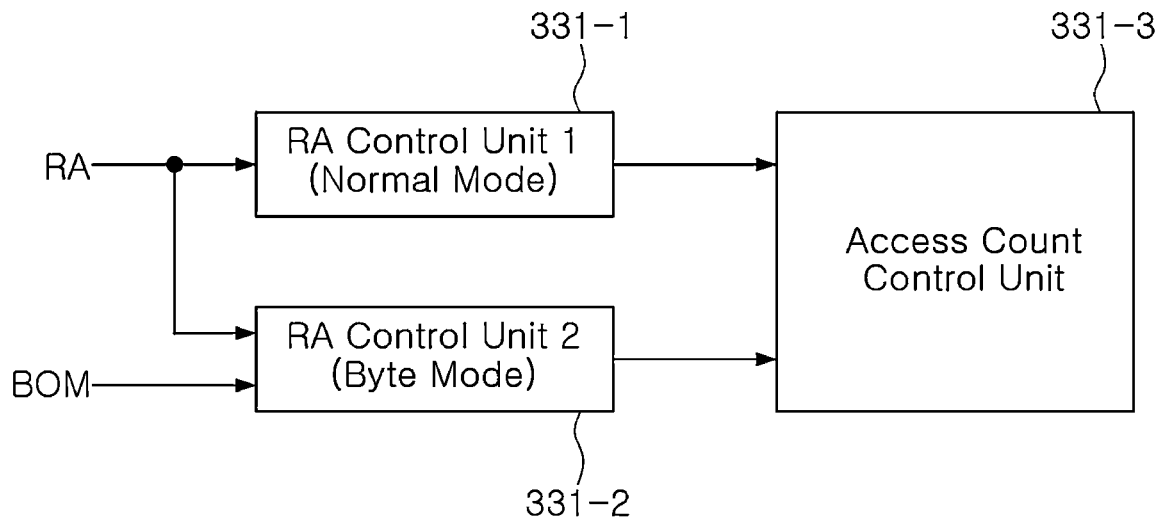
FIG. 3B is a diagram illustrating an access count controller according to an example embodiment of the present disclosure.

FIG. 3B is a diagram illustrating an access count controller according to an example embodiment of the present disclosure. Referring to FIG. 3B, the access count controller 331 may include a first row address control unit 331-1, a second row address control unit 331-2, and an access count control unit 331-3.

The first row address control unit 331-1 may control the access count control unit 331-3 to compare a row address RA, received in a normal mode operation, with a target row address.

The second row address control unit 331-2 may receive byte mode information BOM and the row address RA, and may control the access count control unit 331-3 such that the received row address RA is compared with the target row address while ignoring a page separation bit when the byte mode information BOM indicates a byte mode operation.

The access count control unit 331-3 may control a count-up operation of the access counter 333 in different ways according to the first row address control unit 331-1 and the second row address control unit 331-2. The first row address control unit 331-1 may indicate a first count-up scheme. The second row address control unit 331-2 may indicate a second count-up scheme while ignoring the page separation bit of the row address.

Figure 4:
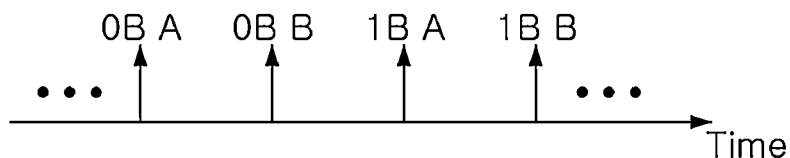
FIG. 4 is a diagram illustrating an effect of an access count storage scheme of a memory device according to an example embodiment of the present disclosure.
Figure 4:
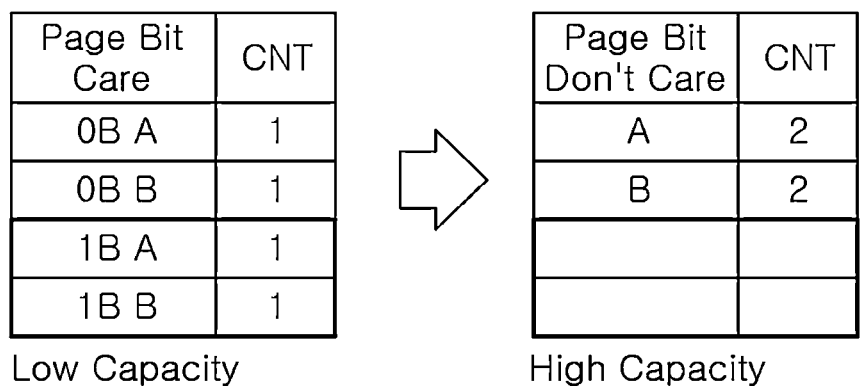

FIG. 4 is a diagram illustrating an effect of an access count storage scheme of a memory device according to an example embodiment of the present disclosure. Referring to FIG. 4, when a page bit is in a "care" state, four access count values for two rows "A" and "B" are managed. However, when a page bit in a "don't care" state, only two access count values for two rows "A" and "B" are managed. In other words, in the "care" state, a page bit for each row is considered and in the "don't care" state, page bits are not considered. Resources, managing the access count values, may be reduced to that extent. As can be seen, the capacity for managing access count values exhibits low-capacity characteristics in technology according to the related art and exhibits high-capacity characteristics in technology according to example embodiments of the present disclosure.

The memory device 100 according to an example embodiment of the present disclosure detects and manages a row hammer address while ignoring a page bit for separating pages in a byte mode operation, and thus, efficiently uses a register.

Figure 5:
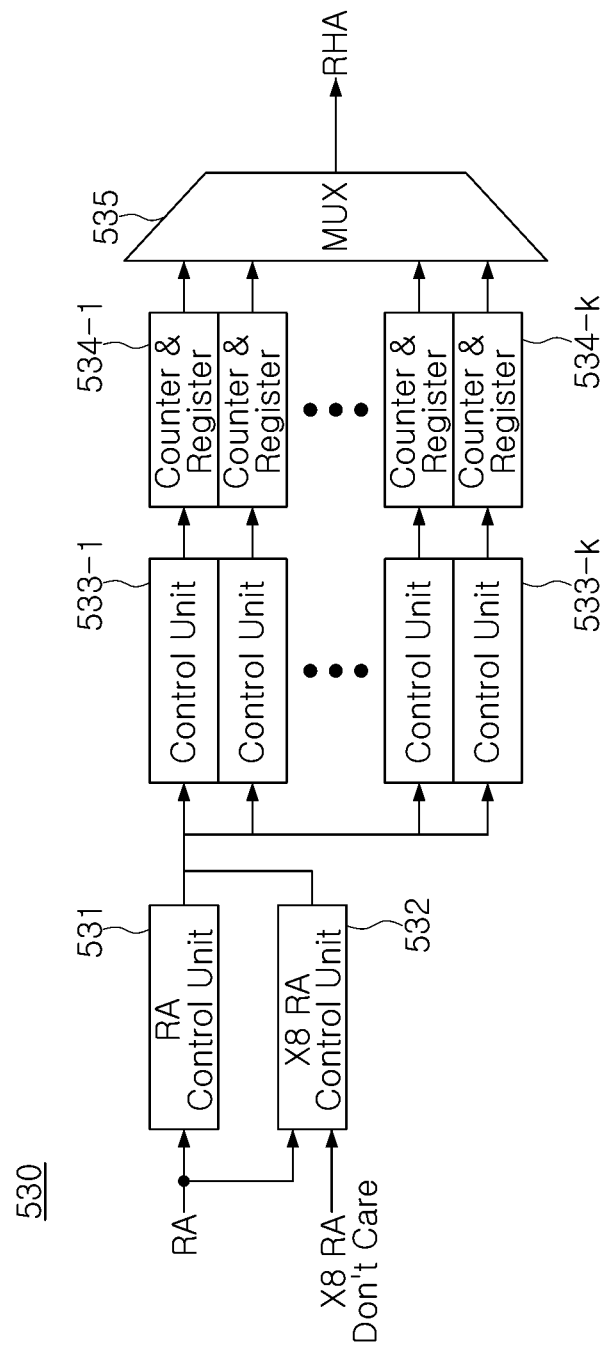
FIG. 5 is a diagram illustrating a row hammer address detector according to an example embodiment of the present disclosure.

FIG. 5 is a diagram illustrating a row hammer address detector 530 according to an example embodiment of the present disclosure.

Referring to FIG. 5, the row hammer address detector 530 may include a first row address control unit 531, a second row address control unit 532, and access count control units 533-1 through 533-$k$ (where k is an integer greater than or equal to 2), counters and registers 534-1 through 534-$k$, and a row hammer address selector 535.

The first row address control unit 531 may receive a row address RA, and may transmit the row address RA to the access count control units 533-1 through 533-$k$ (where k is an integer greater than or equal to 2) as it is.

The second row address control unit 532 may receives the row address RA and X8 RA don't-care information, and may output the row address RA and a row address having a page separation bit, opposing that of the row address RA, to the access count control units 533-1 to 533-$k$ (where k is an integer greater than or equal to 2).

Each of the access count control units 533-1 through 533-$k$ may control a corresponding counter and corresponding registers 534-1 through 534-$k$ to compare a row address, received from the first and second row address control units 531 and 532, with a target row address to perform a count-up operation.

The counters and registers 534-1 through 534-$k$ may perform a count-up operation on the access count value under the control of the corresponding access count control units 533-1 through 533-$k$, or may perform a reset operation.

The row hammer address selector 535 may select at least one of the access count values, stored in the counter and registers 534-1 through 534-$k$, as a row hammer address RHA according to a predetermined method.

Figures 6A, 6B, 7:
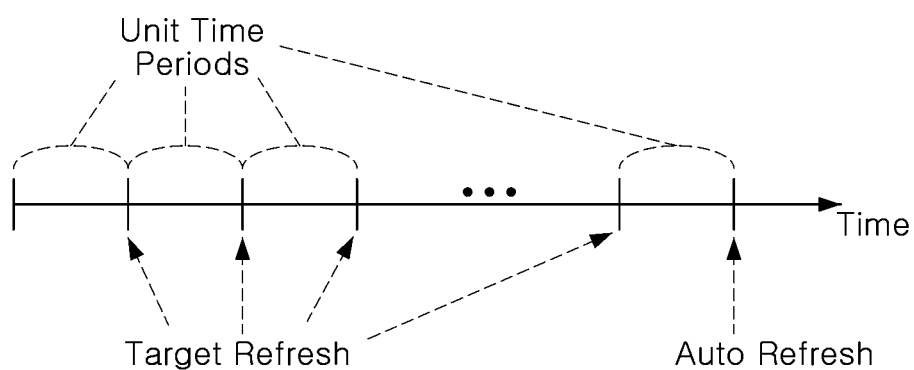
FIGS. 6A and 6B are diagrams illustrating a method of selecting a row hammer address by a row hammer address selector according to an example embodiment of the present disclosure.
FIG. 7 is a diagram illustrating a period of a refresh operation according to an example embodiment of the present disclosure.

FIGS. 6A and 6B are diagrams illustrating a method of selecting a row hammer address by a row hammer address selector 535 according to an example embodiment of the present disclosure.

Referring to FIG. 6A, a target row address TRA3 having the most access count values may be selected as a row hammer address RHA. For example, the row hammer address RHA3 with the highest access count value 500 is selected as the row hammer address RHA. On the other hand, when the target row addresses have the same access count values, row hammer addresses RHA may be selected in the order in which address numbers are increased. For example, referring to FIG. 6B, among target row addresses TRA1 to TRA5 having the same access count values, an address TRA5 having the highest address number may be selected as a row hammer address RHA.

FIG. 7 is a diagram illustrating a period of a refresh operation according to an example embodiment of the present disclosure. Referring to FIG. 7, a target row refresh operation according to a victim row address VRA may be performed per unit time period. The unit time period may be fixed or variable. For example, when a total ACT count value is obtained, the unit time period may be a multiple of a predetermined value of the total ACT count value. In addition, the unit time period may be a predetermined period of an internal clock. In an example embodiment of the present disclosure, the unit time period may be determined depending on a special command (for example, an RFM command) received from an external controller.

In an example embodiment of the present disclosure, an auto-refresh period is divided into a plurality of sections, and the divided sections may each be a unit time period. The auto-refresh period may be tREFI.

Figure 8:
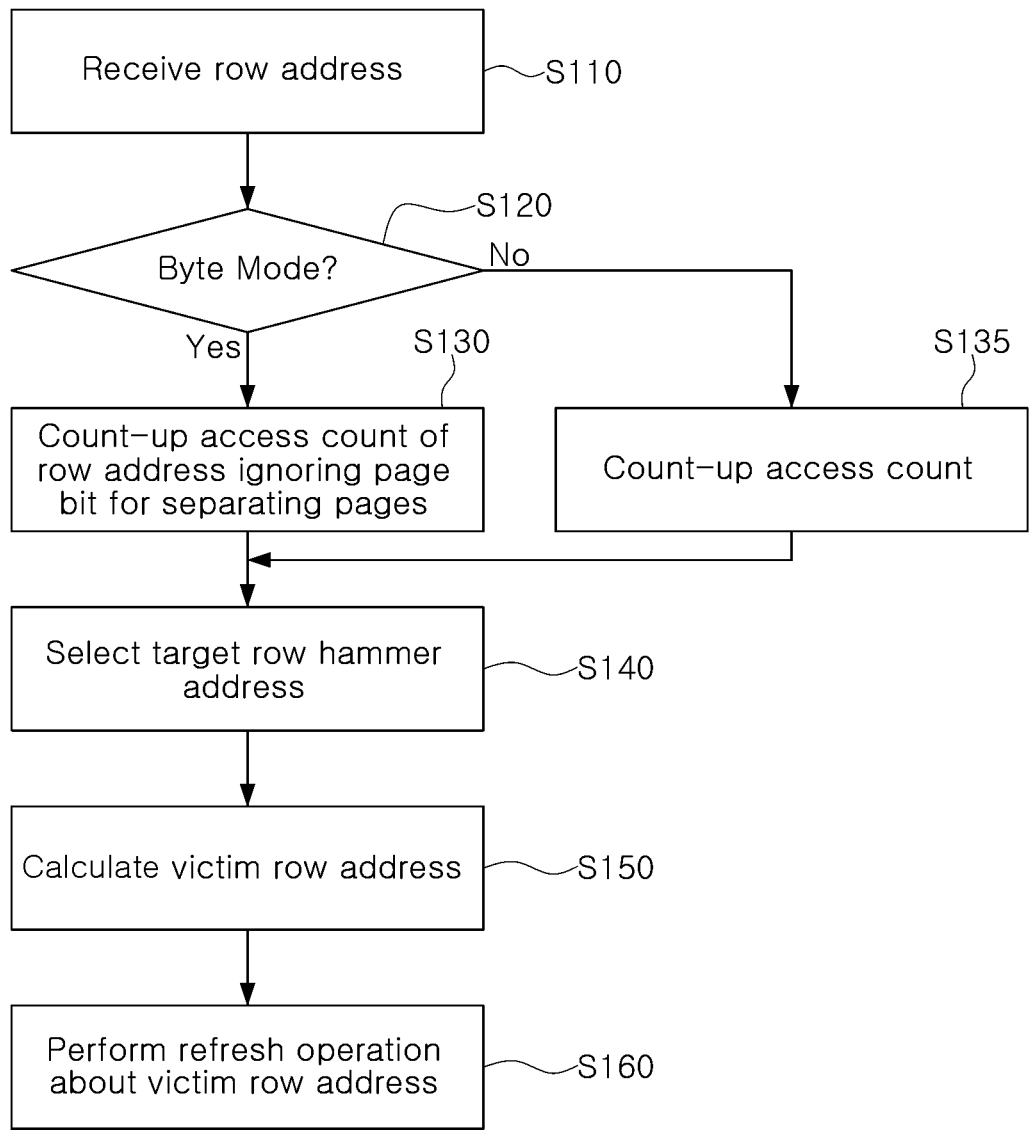
FIG. 8 is a flowchart illustrating an operation of a memory device according to an example embodiment of the present disclosure.

FIG. 8 is a flowchart illustrating an operation of a memory device according to an example embodiment of the present disclosure. Hereinafter, an operation of the memory device 100 will be described with reference to FIGS. 1 to 8.

In operation S110, the memory device 100 may receive a row address according to an input/output request (e.g., a write operation or a read operation). For example, the row address may be provided from an external device such as a host. In operation S120, when an input/output request is made, a determination may be made as to whether an operating mode is a byte operation mode. When the operating mode is the byte operation mode, the memory device 100 may count up an access count value of a corresponding row address while ignoring a page bit for separating pages in the row address. In other words, the memory device 100 does not take into account the page bit for separating pages in the row address. In operation S135, when the operating mode is not the byte operation mode, the memory device 100 may count up an access count value corresponding to the row address.

In operation S140, the memory device 100 may select a target row hammer address having a highest access count value at a predetermined point in time. In operation S150, the memory device 100 may calculate a victim row address adjacent to the selected target row hammer address. In operation S160, the memory device 100 may perform a refresh operation on the victim row address for every predetermined period. For example, the refresh operation may be performed during a row active time tRAS for an access operation. The row active time tRAS may be a time from a point in time, at which an active command ACT is transmitted from the memory controller to the memory device 100, to a point in time at which a precharge command PRE is transmitted.

In an example embodiment of the present disclosure, when the operating mode is a normal mode, an access count value for the row address may be counted up by one. In an example embodiment of the present disclosure, among the access count values, a target row address having a largest value may be selected as a target row hammer address. In an example embodiment of the present disclosure, when all of the access count values are the same, among the target row addresses, a row address having a highest number may be selected as a target row hammer address. In an example embodiment of the present disclosure, when each of the access count values is lower than a reference value, a target refresh operation may not be performed.

In an example embodiment of the present disclosure, the memory device 100 may monitor a row hammer attack in real time. In an example embodiment of the present disclosure, the target refresh operation may be performed per unit time period. In an example embodiment of the present disclosure, the unit time period may be variable. In an example embodiment of the present disclosure, the memory device 100 may periodically receive a refresh command and may perform a normal refresh operation in response to a refresh command. In an example embodiment of the present disclosure, the memory device 100 may count a total count value of a received active command and may perform a target refresh operation each time the total count value is a multiple of a predetermined value.

The memory device 100 according to an example embodiment of the present disclosure may perform a target row refresh operation per unit time period.

Figure 9:
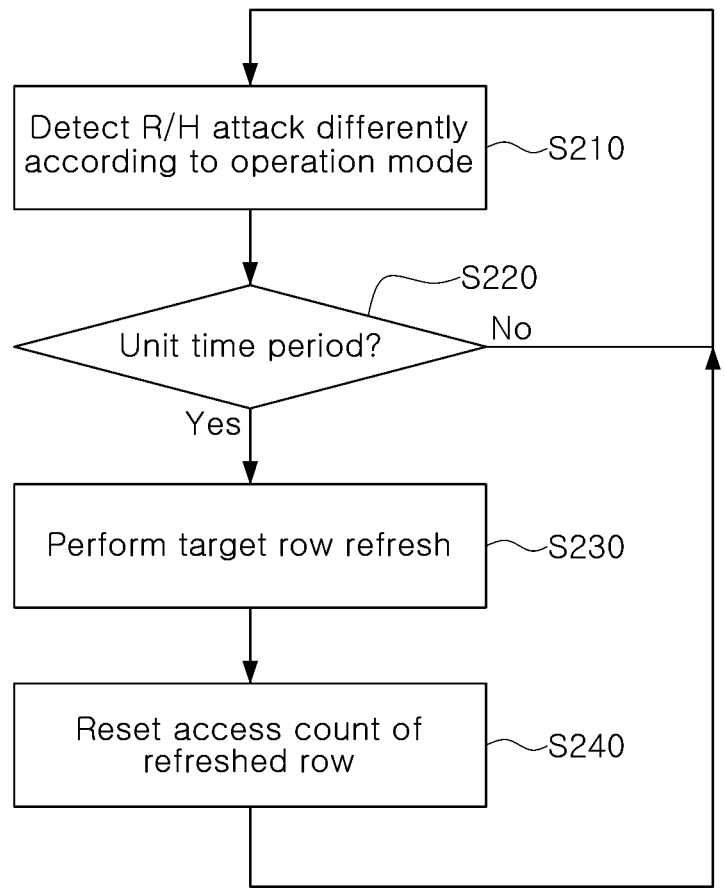
FIG. 9 is a flowchart illustrating an operation of a memory device according to another example embodiment of the present disclosure.

FIG. 9 is a flowchart illustrating an operation of a memory device according to another example embodiment of the present disclosure. Hereinafter, an operation of the memory device 100 will be described with reference to FIGS. 1 to 9.

In operation S210, the memory device 100 may detect a row hammer attack in different way according to an operating mode. For example, when the operating mode is a byte operation mode, a row hammer address may be detected while ignoring a page separation bit. In operation S220, the memory device 100 may determine whether a unit time period has been reached. The unit time period may be internally fixed or variable in the memory device 100. For example, in the unit time period, a value obtained by counting the number of received active commands ACT may be determined as a multiple of a predetermined value.

In operation S230, when the unit time period is reached, the memory device 100 may perform a target row refresh operation using an access count table. However, in example embodiments of the present disclosure, the target row refresh operation does not need to be performed using the access count table. In the target row refresh operation in example embodiments of the present disclosure, a refresh operation may be performed according to a value indicating a row hammer-related victim. In operation S240, the memory device 100 may reset an access count value of a refreshed row.

Figure 10:
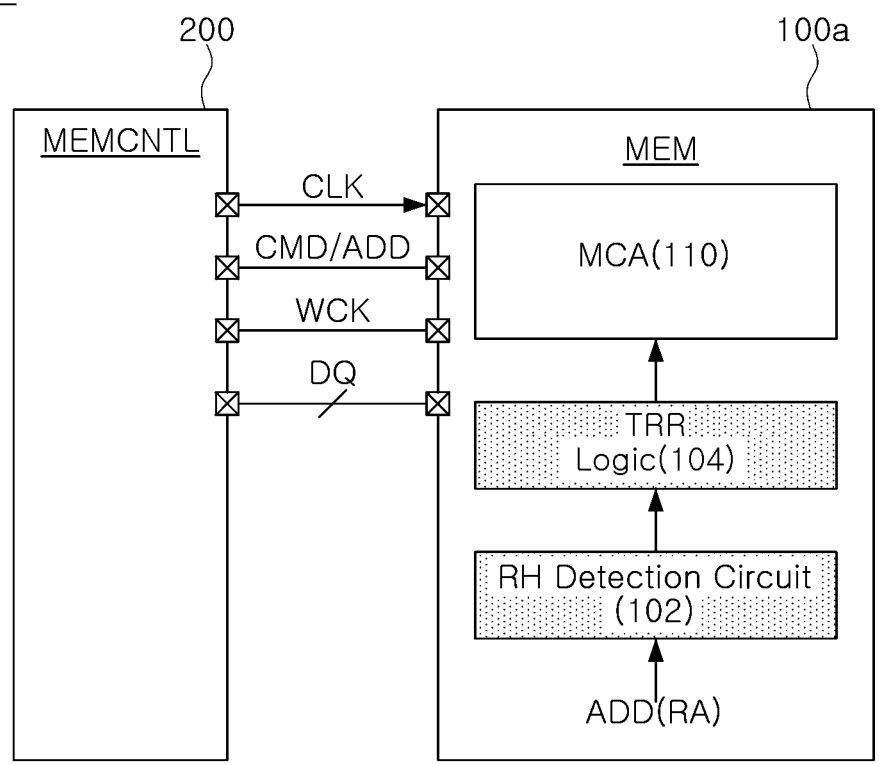
FIG. 10 is a diagram illustrating a memory system according to an example embodiment of the present disclosure.

FIG. 10 is a diagram illustrating a memory system 10 according to an example embodiment of the present disclosure. Referring to FIG. 10, the memory system 10 may include a memory device (MEM) 100a and a memory controller (MEMCNTL) 200 for controlling the memory device 100a.

The memory device 100a may be configured to store data. In an embodiment of the present disclosure, the memory device 100a may be implemented as a volatile memory device. For example, the volatile memory device may be implemented as random access memory (RAM), dynamic RAM (DRAM), static RAM (SRAM), or low power double data rate (LPDDR) DRAM. In an example embodiment of the present disclosure, the memory device 100a may be implemented as a nonvolatile memory device. For example, the nonvolatile memory device may be implemented as an electrically erasable programmable read-only memory (EE-PROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

Continuing to refer to FIG. 10, the memory device 100a may include a row hammer detection circuit 102, a target row refresh logic (TRR Logic) 104, and a memory cell array (MCA) 110.

As described with reference to FIGS. 1 to 9, the row hammer detection circuit 102 may be configured to detect a row hammer address while ignoring a page separation bit in a byte mode operation.

The target row refresh logic (TRR Logic) 104 may be configured to perform a refresh operation on the target row according to a request of an external entity (for example, the MEMCNTL 200) or an internal request. The target row refresh logic 104 may perform a refresh operation on a target row using information of the access count table.

The memory cell array MCA 110 may include a plurality of memory banks. Each of the plurality of memory banks may include a plurality of memory cells connected to wordlines and bitlines.

The memory controller 200 may be configured to control the memory device 100a to read data stored in the memory device 100a or write data to the memory device 100a. The memory controller 200 may provide a command CMD and an address ADDR to the memory device 100a in synchronization with a clock CLK to control a write operation or a read operation performed on the memory device 100a. Data, input and output through data lines DQ, may be transmitted and received between the memory controller 200 and the memory device 100a in synchronization with a data transmission clock WCK.

In addition, the memory controller 200 may provide interfacing between the host and the memory device 100a. The memory controller 200 may exchange data and signals with the memory device 100a through control signal lines /RAS, /CAS, and /WE, an address line ADD, data lines DQ, an alert signal line, and the like.

The memory system 10 according to an example embodiment of the present disclosure may include the memory device 100a, performing a refresh operation while ignoring a page separation bit in a byte mode operation, to effectively handle a row hammer attack using limited resources.

Figure 11:
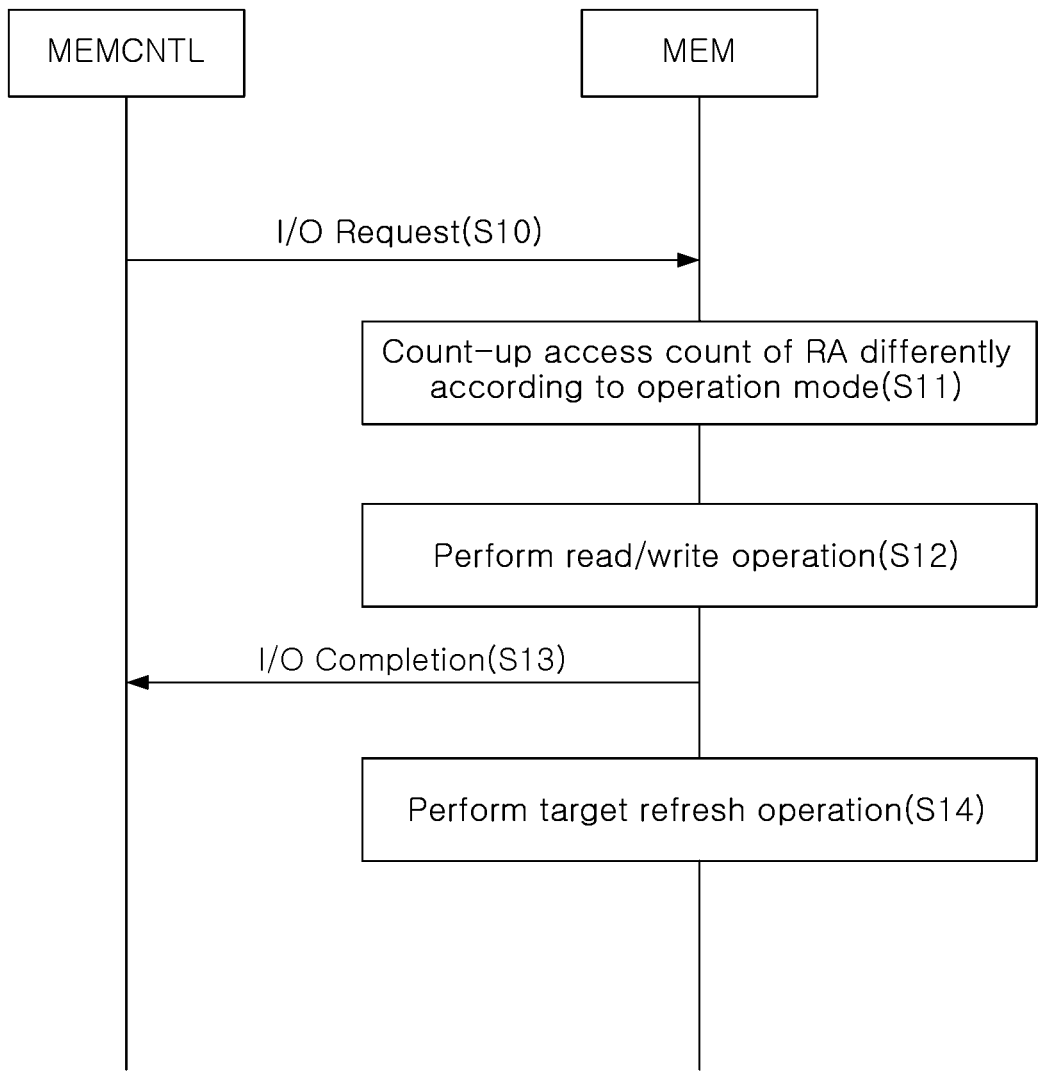
FIG. 11 is a ladder diagram illustrating a refresh operation of a memory system according to an example embodiment of the present disclosure.

FIG. 11 is a ladder diagram illustrating a refresh operation of a memory system according to an example embodiment of the present disclosure.

Referring to FIG. 11, in operation S10, a memory controller MEMCNTL may transmit an input/output (I/O) request to the memory device MEM. The I/O request may be a write request or a read request.

In operation SI 1, the memory device MEM may count-up an access count value for a row address in different ways according to an operating mode. In operation S12, the memory device MEM may perform a read/write operation, corresponding to the input/output request, on memory cells corresponding to a row address. Then, the memory device MEM may transmit a result value, obtained by completing the input/output request, to the memory controller MEMCNTL. For example, read data may be transmitted in the case of a read request, and write completion information may be transmitted in the case of a write request. In operation S14, the memory device MEM may perform a target refresh operation using an access count table per unit time period.

In example embodiments of the present disclosure, a random address may be generated to add a function of handling a row hammer.

Figure 12A:
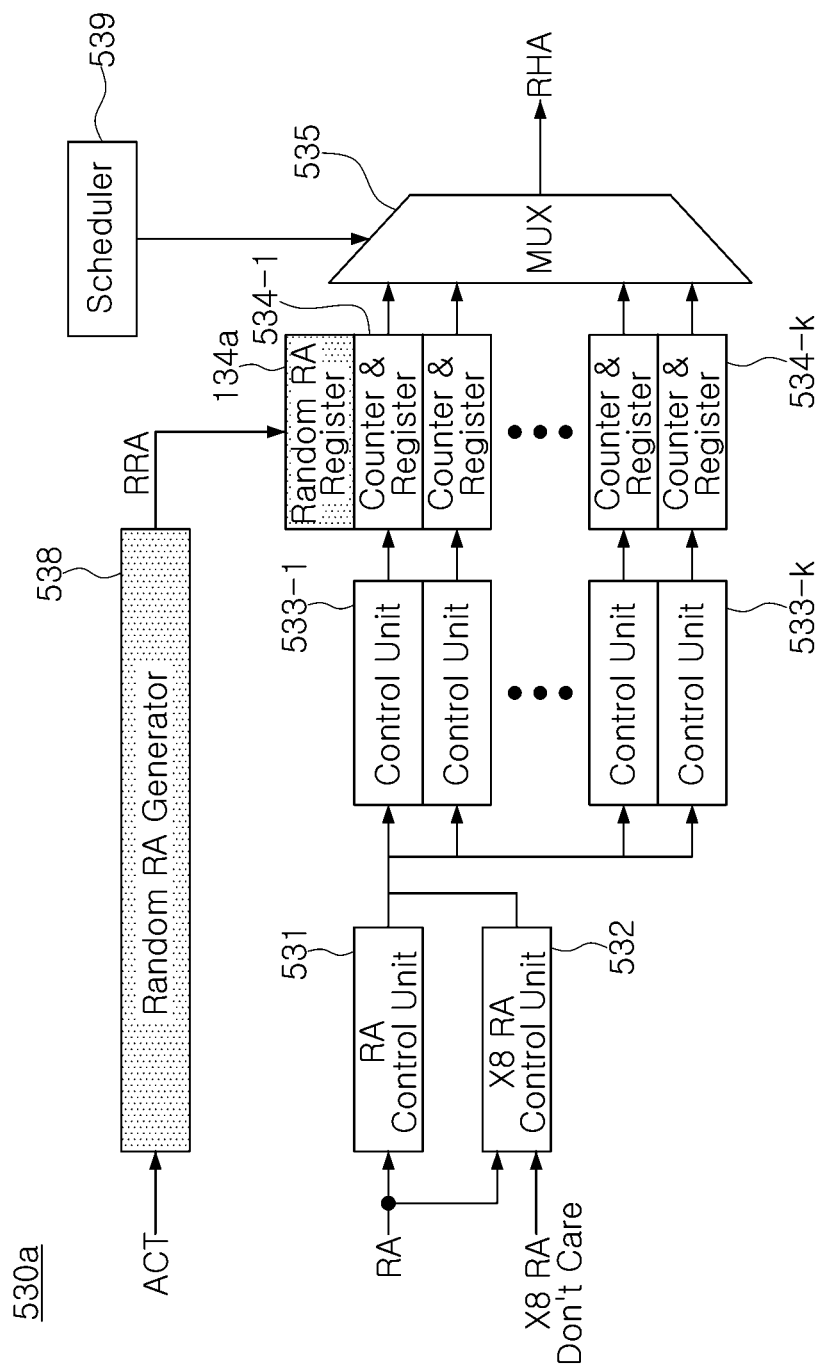
FIG. 12A is a diagram illustrating a row hammer detector according to another example embodiment of the present disclosure.

FIG. 12A is a diagram illustrating a row hammer detector 530a according to another example embodiment of the present disclosure. Referring to FIG. 12A, the row hammer detector 530a may further include a random row address generator 538, a random row address register 143a and a scheduler 539, as compared with the row hammer detector 530 illustrated in FIG. 5.

The random row address generator 538 may be configured to receive an active command ACT and to generate a random row address RRA. The random row address register 143a may store the random row address RRA generated by the random row address generator 538. The scheduler 539 may select one of the random row address RRA, stored in the random row address register 143a, and a row address, having a highest access count value, as a row hammer address RHA.

Figure 12B:
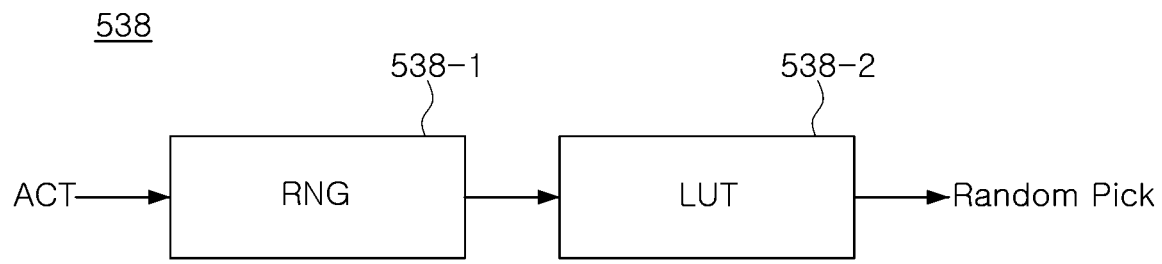
FIG. 12B is a diagram illustrating a random row address generator according to an example embodiment of the present disclosure.

FIG. 12B is a diagram illustrating a random row address generator 538 according to an example embodiment of the present disclosure. Referring to FIG. 12B, the random row address generator 538 may include a random number generator RNG 538-1 and a look-up table 538-2.

The random number generator 538-1 may be configured to receive an active command ACT and to generate random numbers. In an example embodiment of the present disclosure, the random number generator 538-1 may be implemented as a true random number generator. In another example embodiment of the present disclosure, the random number generator 538-1 may be implemented as a pseudo-random number generator. The look-up table 538-2 may be a table for storing the generated random numbers. A random row address RRA (see FIG. 12A) may be generated by randomly picking a value, appropriate to a size of a row address, from the look-up table 538-2.

The memory device according to an example embodiment of the present disclosure may further perform a refresh operation in response to a periodic refresh command received from the memory controller.

The memory device according to an example embodiment of the present disclosure may include a row hammer protection circuit.

Figure 13A:
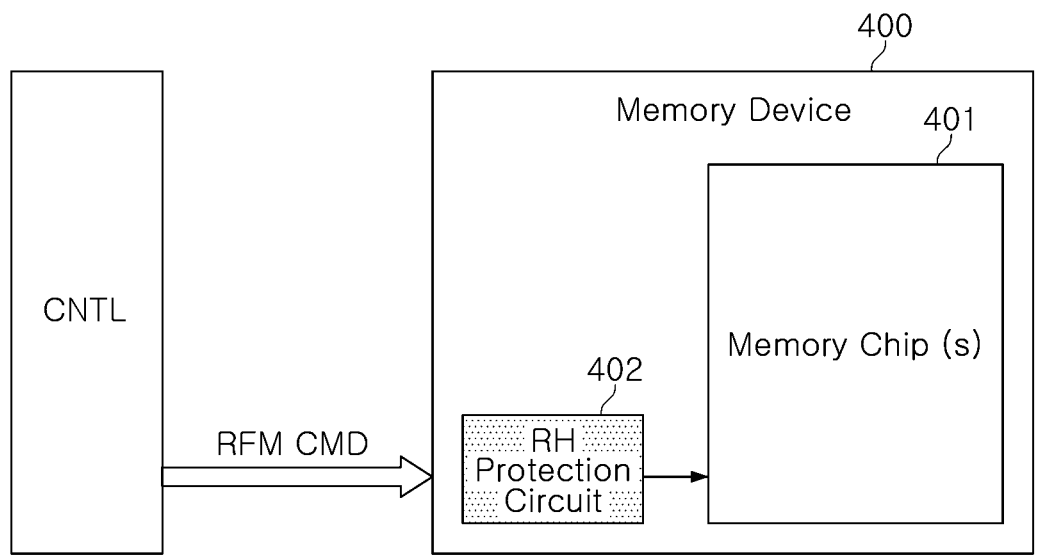
FIGS. 13A and 13B are diagrams illustrating a memory device including a row hammer protection circuit implemented in the form of a chip.
Figure 13B:
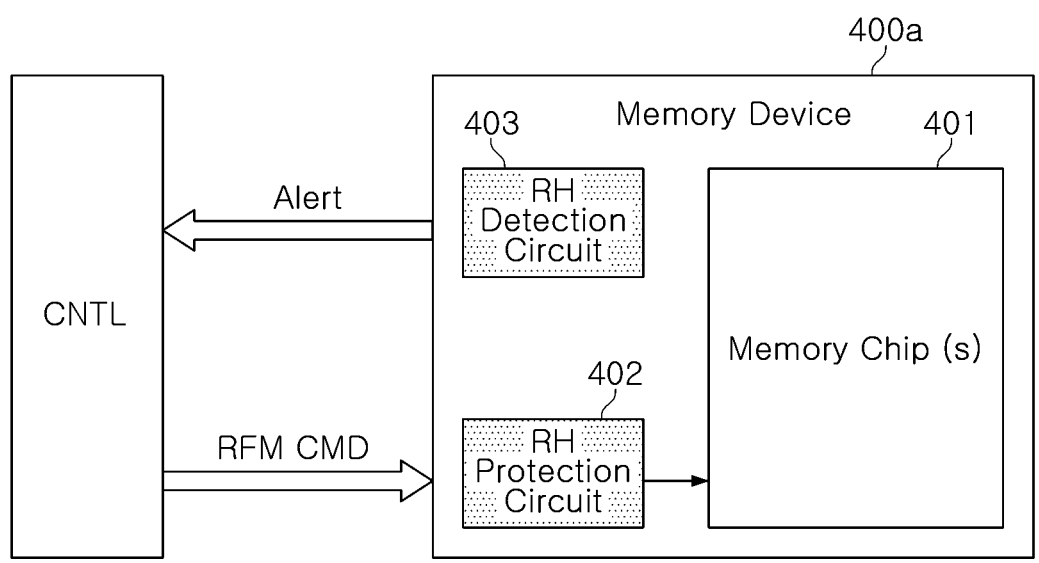

FIGS. 13A and 13B are diagrams illustrating a memory device including a row hammer protection circuit implemented in the form of a chip.

Referring to FIG. 13A, a memory device 400 may include at least one memory chip 401 and a row hammer protection circuit 402 for protecting the memory chip 401 from a row hammer. The row hammer protection circuit 402 may be configured to ignore a data bit for separating pages such that a register is effectively used in the byte mode operation, described in FIGS. 1 to 21B, in response to a command (for example, RFM CMD) received from a controller CNTL.

The memory device 400 according to an example embodiment of the present disclosure may monitor row hammer in real time, and may output an alert signal based on a result of the monitoring.

Referring to FIG. 13B, a memory device 400a may further include a row hammer detection circuit 403, as compared with the memory device 400 of FIG. 13A. The row hammer detection circuit 403 may monitor a row hammer attack in real time, and may output an alert signal to a controller CNTL when the row hammer attack is expected. The controller CNTL may receive the alert signal, and may output a command (for example, RFM CMD) for activating a row hammer protection circuit 402 to the memory device 400a.

The memory device 400a according to an example embodiment of the present disclosure may operate in connection with a refresh management command.

Example embodiments of the present disclosure may be applied to a memory module.

Figure 14:
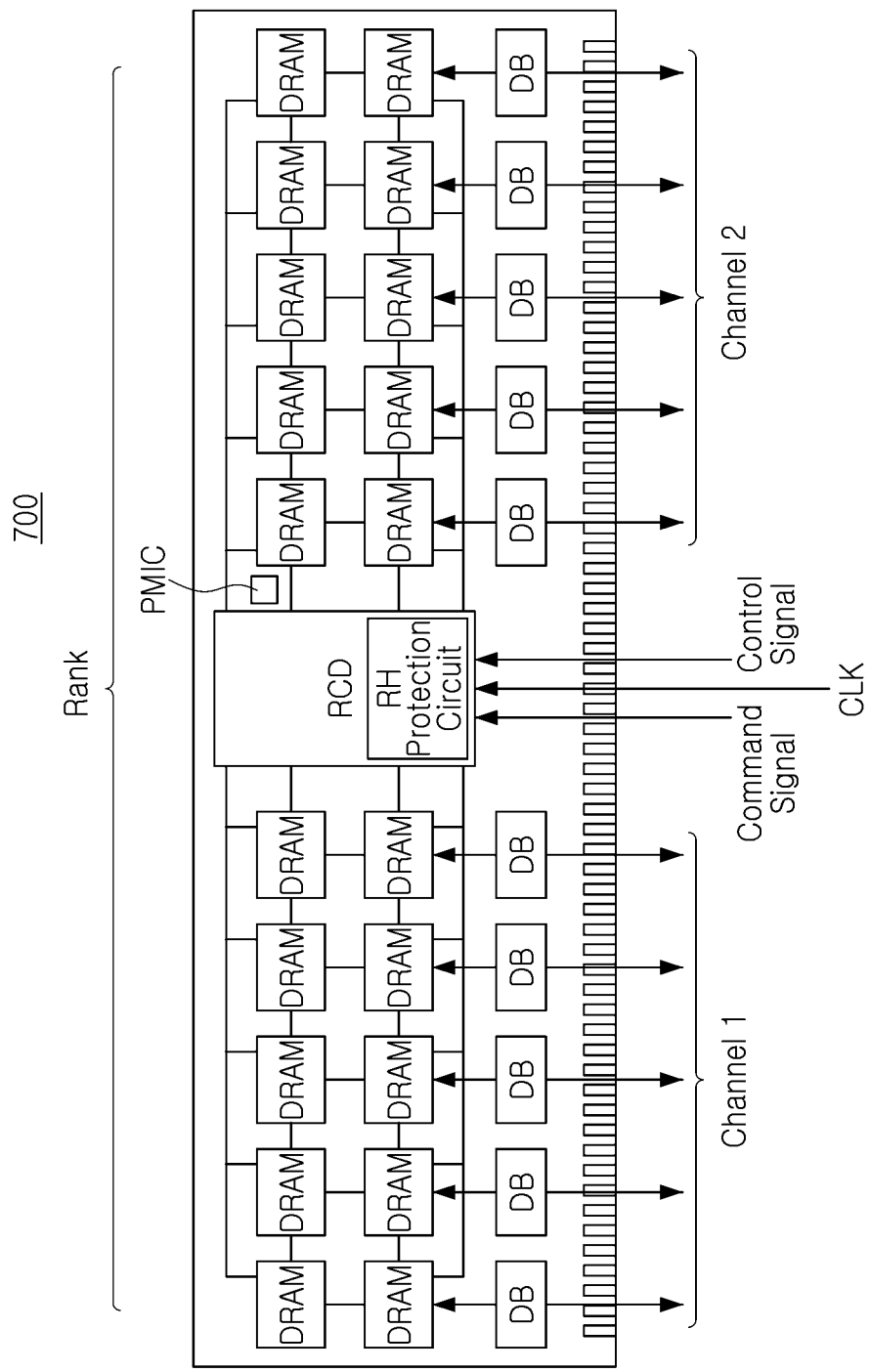
FIG. 14 is a diagram illustrating a memory module according to an example embodiment of the present disclosure.

FIG. 14 is a diagram illustrating a memory module 700 according to an example embodiment of the present disclosure. Referring to FIG. 14, the memory module 700 may include a plurality of memory chips DRAMs each including a memory cell array, and a buffer chip RCD for routing transmission/reception signals with a memory controller or managing memory operations for the memory chips DRAMs, and a power management chip PMIC. Each of the plurality of memory chips DRAMs may be configured to detect and refresh a hammer row address while ignoring a page separation bit in a byte mode operation, as described with reference to FIGS. 1 to 12B.

The buffer chip RCD may control the memory chips DRAMs and the power management chip PMIC under the control of a memory controller. For example, the buffer chip RCD may receive a command signal, a control signal, and a clock signal from the memory controller. In an example embodiment of the present disclosure, the buffer chip RCD may additionally include a row hammer protection circuit.

Each of the memory chips DRAMs may be connected to a corresponding data buffer, among data buffers DB, through a corresponding data transmission line to transmit and receive a data signal DQ and a data strobe signal DQS to and from the corresponding data buffer DB. Each of the memory chips DRAMs may be connected to a data buffer DB through a corresponding data transmission line to transmit and receive parity data and a data strobe signal DQS to and from the corresponding data buffer DB.

A serial presence detect (SPD) may be further included in the memory module 700 and the SPD chip may be an electrically erasable programmable read only memory (EEPROM). The SPD chip may include initial information or device information of the memory module 700. For example, the SPD chip may include initial information or device information such as a module form, a module configuration, storage capacity, a module type, and an execution environment of the memory module 700. When a memory system including the memory module 700 starts, the memory controller may read the device information from the SPD chip and recognize the memory module 700 based on the read device information. In an example embodiment of the present disclosure, a rank may include eight bank groups. Each of the bank groups may include four banks. In an example embodiment of the present disclosure, the memory chips DRAMs may be divided into first channel-only (Channel 1) memory chips and second channel-only (Channel 2) memory chips.

The memory controller may transmit a command to each channel of the memory chips DRAMs. Channels may each have an independent command, an address, and a bus to operate in parallel with each other. A single channel may include one or more ranks, and each of the ranks may include an independent DRAM device. In addition, all ranks in the channel may perform operations in parallel. Each rank may include a plurality of banks, and DRAM cells may be two-dimensionally present in the banks. Each bank is operable in parallel.

The memory device according to example embodiments of the present disclosure may be applied to a computing device.

Figure 15:
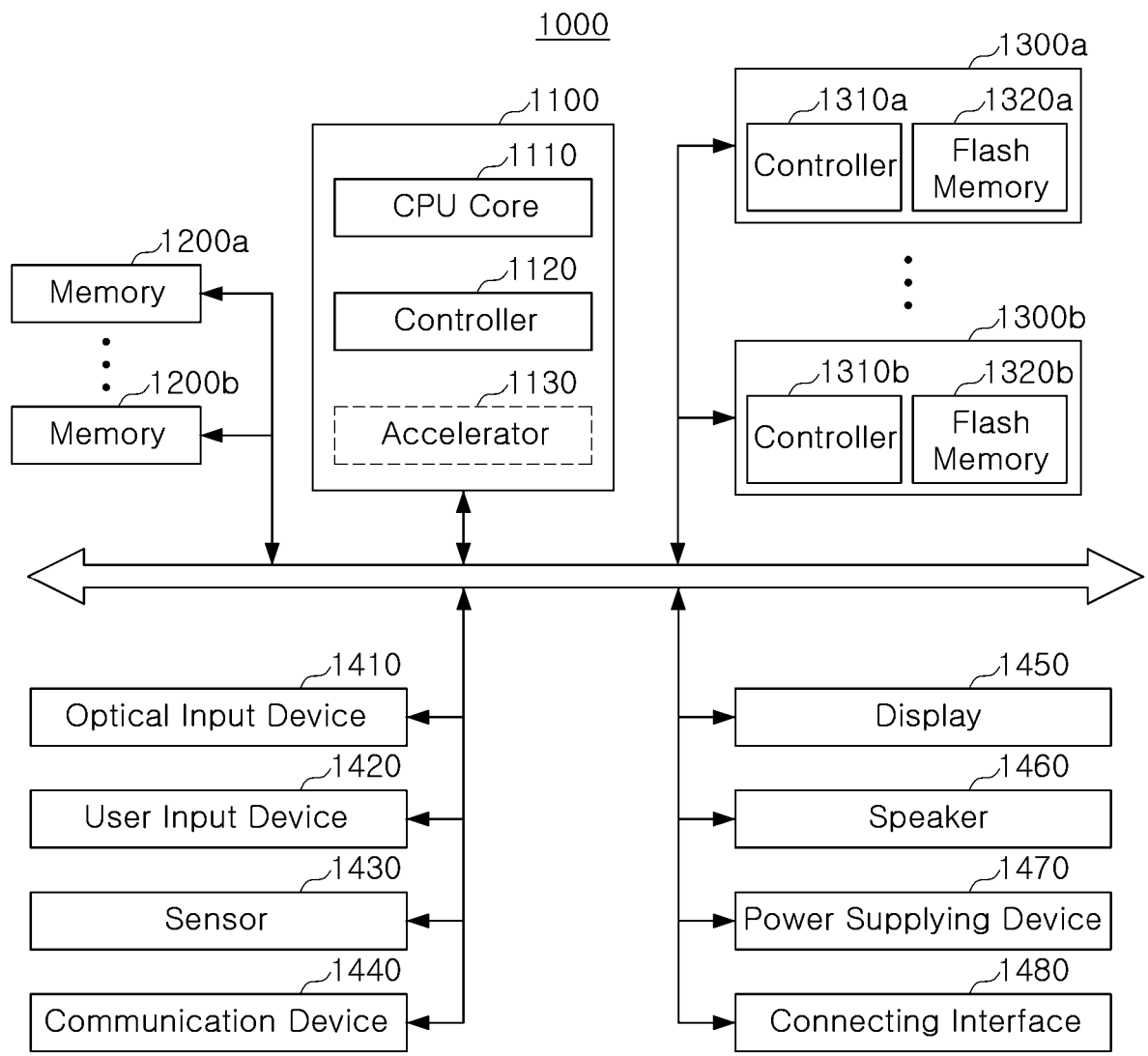
FIG. 15 is a diagram illustrating a computing system according to an example embodiment of the present disclosure.

FIG. 15 is a diagram illustrating a computing system 1000 according to an example embodiment of the present disclosure. Referring to FIG. 15, the computing system 1000 may include a main processor 1100, memories 1200a and 1200b, and storage devices 1300a and 1300b, and may further include at least one of an image capturing device (or optical input device) 1410, a user input device 1420, a sensor 1430, a communications device 1440, a display 1450, a speaker 1460, a power supplying device 1470, and a connecting interface 1480.

The main processor 1100 may control the overall operation of the computing system 1000, and more specifically, operations of other components constituting the computing system 1000. The main processor 1100 may be implemented as a general-purpose processor, a specific-purpose processor, or an application processor.

The main processor 1100 may include one or more CPU cores 1110, and may further include a controller 1120 for controlling the memories 1200a and 1200b or the storage devices 1300a and 1300b. In an example embodiment of the present disclosure, the main processor 1100 may further include an accelerator block 1130, e.g., a dedicated circuit for a high-speed data operation such as an artificial intelligence (AI) data operation. The accelerator block 1130 may include a graphics processing unit (GPU), a neural processing unit (NPU), and/or a data processing unit (DPU), and may also be implemented as an additional chip, physically independent of other components of the main processor 1100.

The memories 1200a and 1200b may be used as a main memory device of the computing system 1000, and may include volatile memories such as an SRAM or a DRAM, but may also include nonvolatile memories such as a flash memory, a PRAM or an RRAM. The memories 1200a and 1200b may be implemented in the same package as the main processor 1100. For example, the memories 1200a and 1200b may perform a refresh operation while ignoring a page separation bit in a byte mode operation, as described with reference to FIGS. 1 to 12B.

The storage devices 1300a and 1300b may serve as nonvolatile storage devices storing data irrespective of whether power is supplied or not, and may have relatively high storage capacity, as compared with the memories 1200a and 1200b. The storage devices 1300a and 1300b may include storage controllers 1310a and 1310b and nonvolatile memory (NVM) storage 1320a and 1320b storing data under the control of the storage controllers 1310a and 1310b. The nonvolatile memories 1320a and 1320b may include a V-NAND flash memory having a two-dimensional (2D) structure or a three-dimensional (3D) structure, but may include other types of nonvolatile memory such as a PRAM, an RRAM, or the like.

The storage devices 1300a and 1300b may be included in the computing system 1000 while being physically separated from the main processor 1100, or may be implemented in the same package as the main processor 1100. In addition, the storage devices 1300a and 1300b may have the same shape as a solid-state device (SSD) or a memory card, and thus, may be removably coupled to other components of the computing system 1000 through an interface such as the connecting interface 1480 to be described later. The storage devices 1300a and 1300b may be devices to which a standard protocol such as a universal flash storage (UFS), an embedded multimedia card (eMMC), or nonvolatile memory express (NVMe) is applied, without being limited thereto.

The image capturing device 1410 may capture a still image or a video, and may include a camera, a camcorder, and/or a webcam.

The user input device 1420 may receive various types of data input from the user of the computing system 1000, and may include a touchpad, a keypad, a keyboard, a mouse, and/or a microphone.

The sensor 1430 may detect various types of physical quantity obtained from an external entity of the computing system 1000, and may convert the sensed physical quantity into an electrical signal. The sensor 1430 may include a temperature sensor, a pressure sensor, an illuminance sensor, a location sensor, an acceleration sensor, a biosensor, and/or a gyroscope sensor.

The communication device 1440 may transmit and receive signals between other devices outside the computing system 1000 according to various communication protocols. The communication device 1440 may include an antenna, a transceiver, and/or a modem.

The display 1450 and the speaker 1460 may serve as output devices, respectively outputting visual information and auditory information to a user of the computing system 1000.

The power supplying device 1470 may appropriately convert power supplied from a battery embedded in the computing system 1000 or an external power source, and may supply the converted power to each of components of the computing system 1000.

The connecting interface 1480 may provide connection between the computing system 1000 and an external device connected to the computing system 1000 to be able to transmit and receive data to and from the computing system 1000. The connecting interface 1480 may be implemented using various interface schemes, such as advanced technology attachment (ATA), serial ATA (SATA), external SATA (e-SATA), small computer small interface (SCSI), serial attached SCSI (SAS), peripheral component interconnection (PC), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 16:
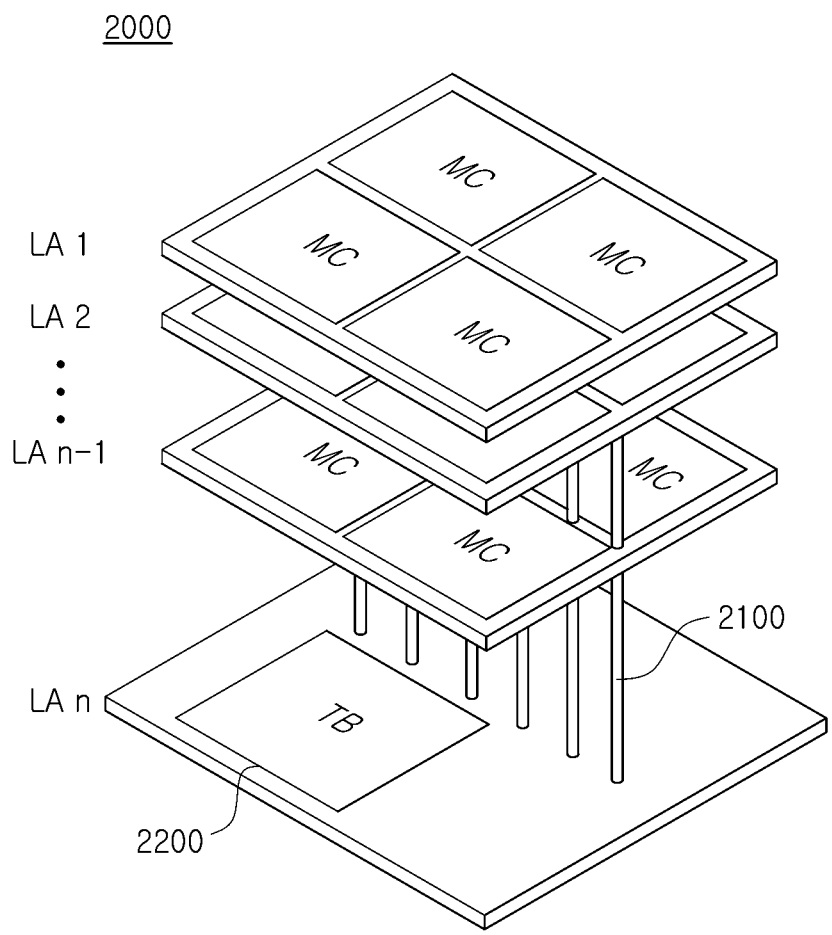
FIG. 16 is a block diagram illustrating a semiconductor package having a stack structure including a plurality of layers according to an example embodiment of the present disclosure.

FIG. 16 is a block diagram illustrating a semiconductor package having a stack structure including a plurality of layers according to an example embodiment of the present disclosure.

Referring to FIG. 16, a semiconductor package 2000 may include a plurality of layers LA1 to LAn. Each of the first layer LA1 to the n–1-th layer LAn may be a memory layer (or a memory chip) including a plurality of memory cores MC. The memory core MC may include a memory cell array for storing data, a row decoder, a column decoder, a sense amplifier circuit, and an error correction circuit. As described above, the memory core MC in example embodiments of the present disclosure may perform different target refresh operations in a byte mode and a normal mode.

The n-th layer LAn may be a buffer layer (or a buffer chip). In the semiconductor package 2000, the layers LA1 to LAn having a stack structure may be connected to each other through a through-silicon via (TSV) 2100. The buffer layer LAn may communicate with an external memory controller and the memory layers LA1 to LAn-1, and may route transmission/reception signals between the memory layers LA1 to LAn-1 and the memory controller. In addition, the buffer layer LAn may queue signals received from the memory controller or the memory layers LA1 to LAn-1. In addition, the buffer layer LAn may include a training block 2200. The buffer layer LAn may perform a training operation on the memory layers LA1 to LAn-1 using the training block 2200.

Figure 17:
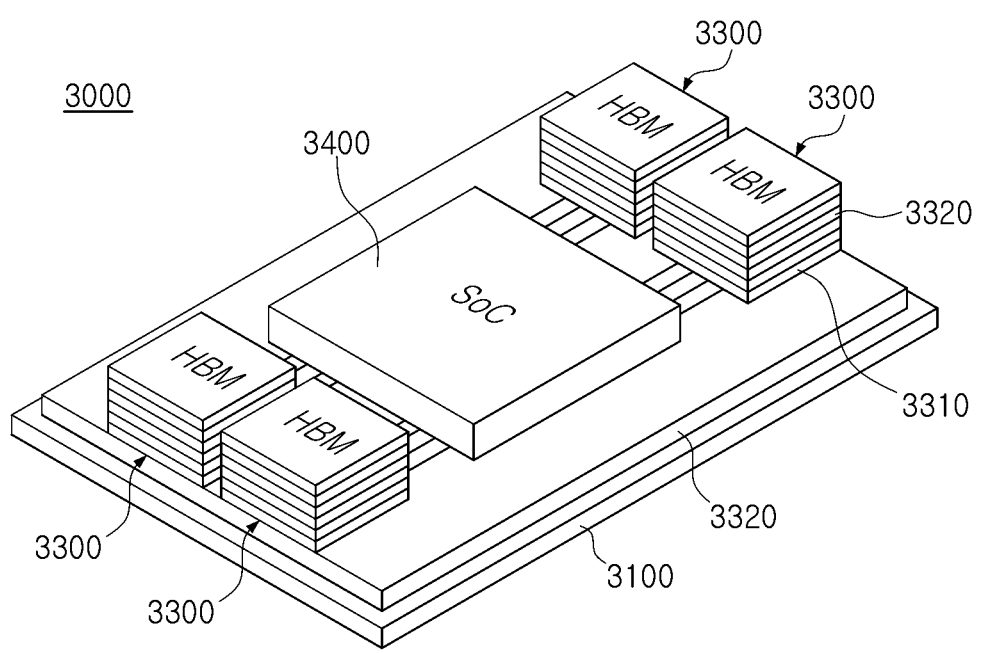
FIG. 17 is a diagram illustrating a semiconductor package including a stack semiconductor chip according to an example embodiment of the present disclosure.

FIG. 17 is a diagram illustrating a semiconductor package including a stack semiconductor chip according to an example embodiment of the present disclosure. Referring to FIG. 17, a semiconductor package 3000 may be a memory module including at least one stack semiconductor chip 3300, mounted on a package substrate 3100 such as a printed circuit board (PCB), and a system-on-chip (SOC) 3400. An interposer may be optionally provided on the package substrate 3100. The stack semiconductor chip 3300 may be formed as a chip-on-chip (CoC).

The stack semiconductor chip 3300 may include at least one memory chip 3320 stacked on a buffer chip 3310 such as a logic chip. The memory chip 3320 may perform a row hammer detection operation while ignoring a page separation bit in a byte mode, as described with reference to FIGS. 1 to 12B.

The buffer chip 3310 and the at least one memory chip 3320 may be connected to each other by a through-silicon via (TSV). The buffer chip 3310 may perform a training operation on the memory chip 3320. The stack semiconductor chip 3300 may be, for example, a high bandwidth memory (HBM) of 500 GB/sec to 1 TB/sec or higher.

A general memory device separates row addresses according to pages, and a row hammer refresh operation is actually performed without separating pages.

A memory device according to an example embodiment of the present disclosure does not separate row addresses according to pages, so that efficiency of a register for searching a row hammer address is improved.

As described above, in a memory device according to example embodiments of the present disclosure, a memory system including the same, and a method of operating the same, a page separation bit may be ignored to improve row hammer detection efficiency.

In addition, a row hammer attack may be prevented to improve reliability of data.

While example embodiments of the present disclosure have been shown and described above, it will be apparent to those skilled in the art that modifications and variations could be made thereto without departing from the scope of the present disclosure as set forth by the appended claims.

What is claimed is:

1. An operating method of a memory device, the method comprising:
   receiving a row address;
   determining whether an operating mode is a byte mode;
   counting up an access count value for the row address while ignoring a page bit, when the operating mode is the byte mode;
   selecting a target row hammer address, among target row addresses, using access count values for the target row hammer address;
   calculating a victim row address corresponding to the target row hammer address; and
   performing a target refresh operation on the victim row address.

2. The method of claim 1, further comprising:
   counting up the access count value for the row address when the operating mode is a normal mode.

3. The method of claim 1, wherein:
the selecting the target row hammer address comprises selecting a target row address having a largest value, among the access count values, as the target row hammer address.

4. The method of claim 1, wherein:
the selecting the target row hammer address comprises selecting a row address having a highest number, among the target row addresses, as the target row hammer address when all of the access count values are the same.

5. The method of claim 1, wherein:
the target refresh operation is not performed when each of the access count values is lower than a reference value.

6. The method of claim 1, further comprising:
detecting a row hammer attack.

7. The method of claim 1, wherein:
the target refresh operation is performed per unit time period.

8. The method of claim 7, wherein:
the unit time period is variable.

9. The method of claim 1, further comprising:
periodically receiving a refresh command; and
performing a normal refresh operation in response to the refresh command.

10. The method of claim 1, further comprising:
counting a total count value of a received active command, wherein:
the target refresh operation is performed each time the total count value is a multiple of a predetermined value.

11. A memory system, comprising:
at least one memory device; and
a memory controller configured to control the at least one memory device,
wherein:
the at least one memory device detects a row hammer address while not considering a page separation bit of a row address in a byte mode operation such that different pages within the same row are not differentiated, generates a victim address corresponding to the detected row hammer address, and performs a target refresh operation on the victim address.

12. The memory system of claim 11, wherein:
the at least one memory device comprises:
 a row hammer detection circuit configured to receive the row address and to output the row hammer address; and
 a target refresh address generator configured to generate a victim row address corresponding to the row hammer address.

13. The memory system of claim 11, wherein:
the at least one memory device receives a refresh management command from the memory controller.

14. The memory system of claim 11, wherein:
the at least one memory device comprises:
a normal refresh address generator configured to receive a refresh command from the memory controller and to generate a normal refresh address in response to the normal refresh command; and
a row hammer detector configured to receive the row address and an active command and to generate the row hammer address.

15. The memory system of claim 14, wherein:
the at least one memory device further comprises a victim row address selector configured to select one of the normal refresh address and the row hammer address as a victim row address.

* * * * *